United States Patent [19]

Sugimoto

[11] Patent Number: 4,823,352
[45] Date of Patent: Apr. 18, 1989

[54] SEMICONDUCTOR LASER WITH A VARIABLE OSCILLATION WAVELENGTH

[75] Inventor: Mitsunori Sugimoto, Tokyo, Japan

[73] Assignee: NEC Corporation, Tokyo, Japan

[21] Appl. No.: 15,252

[22] Filed: Feb. 13, 1987

[30] Foreign Application Priority Data

Feb. 14, 1986 [JP] Japan .................. 61-31207

[51] Int. Cl.⁴ .............................................. H01S 3/19
[52] U.S. Cl. ...................................... 372/45; 372/46; 372/20; 372/50
[58] Field of Search .................. 372/44, 45, 46, 20, 372/50

[56] References Cited

FOREIGN PATENT DOCUMENTS 0121990  7/1984  Japan .................... 372/46
0184583  10/1984 Japan .................... 372/45
0062176  4/1985  Japan .................... 372/46

OTHER PUBLICATIONS

Yamaguchi et al., "Wide Range Wavelength Tuning in 1.3 μm DBR-DC-PBH-LD's by Current Injection Into the DBR Region", Electronics Letters, Jan. 17, 1985, vol. 21, No. 2, pp. 63–65.

Arakawa et al., "Active Q-switching in a GaAs/AlGaAs Multiquantum Well Laser with an Intracavity Monolithic Loss Modulator", Appl. Phys. Lett., vol. 48, No. 9, Mar. 3, 1986, pp. 561–563.

Primary Examiner—William L. Sikes
Assistant Examiner—Georgia Y. Epps
Attorney, Agent, or Firm—Sughrue, Mion, Zinn, Macpeak & Seas

[57] ABSTRACT

An improved semiconductor laser comprises an active region of quantum well, at least two cladding layers positioned at both sides of said active region, and two electrodes provided separately at one side of at least one cladding layer of said at least two cladding layers so that a laser oscillation is produced in a wide wavelength range and high response rate for the reason why the wavelength of a laser oscillation can be changed in wavelengths in the vicinity of transition energy $E_{ke\text{-}HH}$ between n=k electron quantum and n=k heavy hole quantum level (k=1, 2, 3 - - -) in accordance with the control of current to be injected from one electrode of said two electrodes or voltage to be applied to said one electrode.

5 Claims, 3 Drawing Sheets

SEMICONDUCTOR LASER WITH A VARIABLE OSCILLATION WAVELENGTH

FIELD OF THE INVENTION

The invention relates to a semiconductor laser, and more particularly to a semiconductor laser in which an oscillation wavelength can be changed in a wide range and high response rate.

BACKGROUND OF THE INVENTION

In a conventional semiconductor laser, an oscillation wavelength is changed in accordance with the energy band gap in an active region by controlling temperature thereof. In other words, the energy band gap in an active region is controlled depending upon the temperature thereof. Accordingly, a semiconductor laser can be applied to the several uses requiring different oscillation wavelengths respectively in the field of an optical communication system, an optical information processing system etc. For the adoption of such a semiconductor laser in the systems mentioned above, the size thereof can be smaller and the consuming power therein can be reduced.

According to the semiconductor laser in which the temperature thereof is controlled, however, the range of an oscillation wavelength is controlled as wide as several ten Å and a maximum response rate thereof is not so high as expected in a specific use.

In addition to the semiconductor laser mentioned above, there has been proposed a semiconductor laser in which an oscillation wavelength is changed by controlling the Bragg wavelength as described on pages 63 to 65 of "ELECTRONICS LETTERS Jan. 17th 1985 Vol. 21 No. 2".

According to the semiconductor laser described therein, however, an oscillation wavelength is changed in accordance with the refractive index of lattice so that the range to be changed is not so wide as expected.

SUMMARY OF THE INVENTION

Accordingly, it is an object of the invention to provide a semiconductor laser in which an oscillation wavelength is changed in a wide range.

It is a further object of the invention to provide a semiconductor laser in which an oscillation wavelength is changed in a high response rate.

According to the invention, there is provided a semiconductor laser comprising an active region of quantum well, at least two cladding layers positioned at both sides of said active region, two electrodes provided separately at one side of at leaast one cladding layer of said at least two cladding layers, and an electrode common to said two electrodes across which a power source is connected, wherein transition energy $E_{ke\text{-}HH}$ between $n=k$ electron quantum level and $n=k$ heavy hole quantum level ($k=1, 2, 3 \ldots$) is selected in producing a laser oscillation in accordance with the control of current to be injected from at least one electrode of said two electrodes or voltage to be applied to said at least one electrode.

BRIEF DESCRIPTION OF THE DRAWINGS

The invention will be explained in more detail in accordance with following drawings wherein.

DESCRIPTION OF PREFERRED EMBODIMENT

Figure 1:
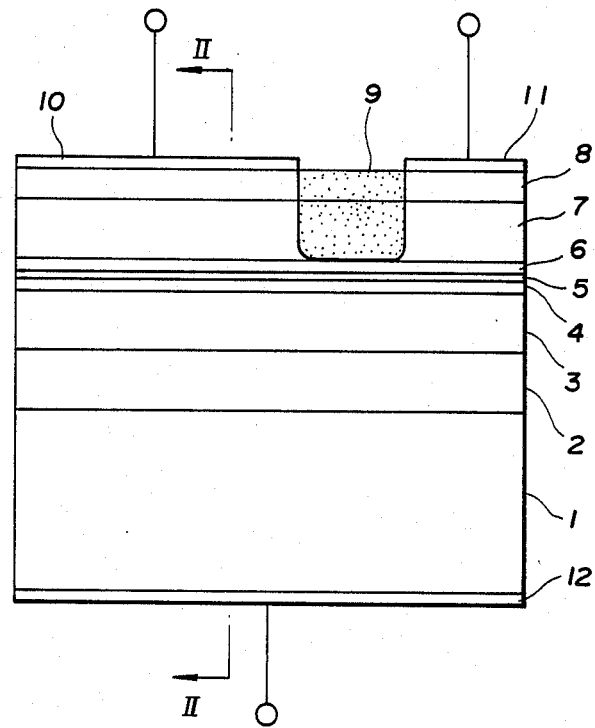
FIG. 1 is a cross sectional view perpendicular to a plane of a resonator in an embodiment according to the invention.
Figure 2:
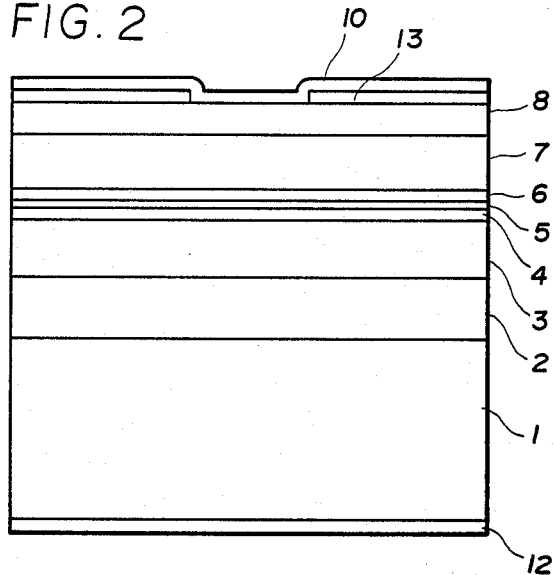
FIG. 2 is a cross sectional view along line II—II in FIG. 1, FIGS. 3A and 3B are explanatory diagrams explaining the distribution of electron energy during laser oscillation.

In FIGS. 1 and 2, there is shown a semiconductor laser comprising a substrate 1 of n-GaAs, a buffer layer 2 of n-GaAs, an n-cladding layer 3 of n-$Al_{x_{c1}}Ga_{1-x_{c1}}As$, first guiding layer 4 of $Al_{x_{g1}}Ga_{1-x_{g1}}As$, a quantum well 5 of $Al_{x_w}Ga_{1-x_w}As$, second guiding layer 6 of $Al_{x_{g2}}Ga_{1-x_{g2}}As$, a p-cladding layer 7 of p-$Al_{x_{c2}}Ga_{1-x_{c2}}As$, a cap layer 8 of p-GaAs, a high resistance region 9, first and second p-electrodes 10 and 11, an n-electrode 12, and $SiO_2$ film 13. In the semiconductor laser, the n-cladding layer 3 is of 0.5 to 3 μm, typically 1 to 1.5 μm, in its thickness and $Xc_1$ thereof is larger than $Xg_1$ of the first guiding layer 4 ($Xc_1 > Xg_1$), the first guiding layer 4 is of 500 to 3000 Å, typically 1000 to 2000 Å, in its thickness and $Xg_1$ thereof is larger, typically 0.2 to 0.3, then $Xw$ of the quantum well 5 ($Xw < Xg_1 < Xc_1$), the quantum well 5 is of less than 300 Å, typically 60 to 200 Å in its thickness and $Xw$ thereof is less, typically zero, than $Xg_1$ of the first guiding layer 4 ($Xw < Xg_1$), the second guiding layer 6 is of 500 to 3000 Å, typically 1000 to 2000 Å, in its thickness and $Xg_2$ thereof is larger, typically 0.2 to 0.3, than $Xw$ of the quantum well 5 ($Xw < Xg_1 < Xg_2$), and the p-cladding layer 7 is of 0.5 to 3 μm, typically 1 to 1.5 μm, in its thickness and $Xc_2$ thereof is larger, typically 0.4 to 0.8, than $Xg_2$ of the second guiding layer 6 ($Xw < Xg_2 < Xc_2$). As explained above, the first and second p-electrodes 10 and 11 are separated in the direction of a resonator by the high resistance region 9 so that the current therefrom are injected independently.

Figure 3A:
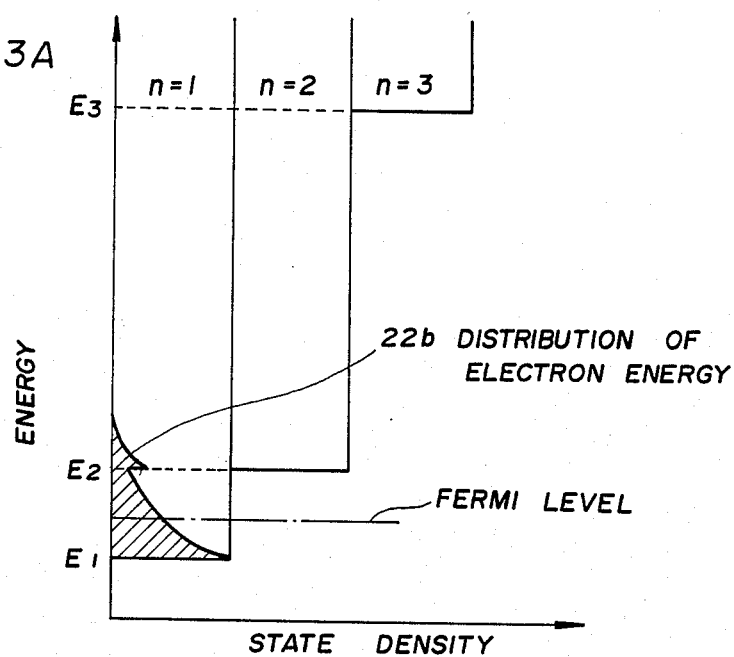
Figure 3B:
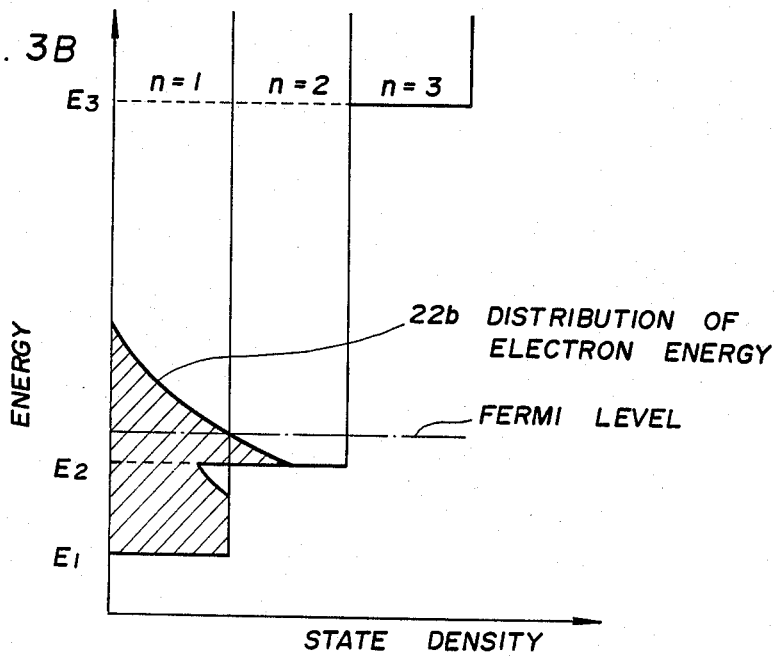

In operation, the current injection is performed from the first and second p-electrodes 10 and 11 with the same current density as one another whereby an oscillation is produced at a wavelength $\lambda_1$ in the vicinity of fundamental transition energy $E_{1e\text{-}HH}$ between $n=1$ electron quantum level and $n=1$ heavy hole quantum level in the same manner as a normal quantum well laser. On the other hand, if the current injection is decreased, for instance, down to zero in its level from the second p-electrode 11, the whole loss of a resonator is increased so that a gain thereof which is necessary for a laser oscillation is to be increased. As a result, such an oscillation will not be produced unless the current injection is increased from the first p-electrode 10 up to a predetermined level. In a case where an oscillation is produced at a threshold level thereof, a carrier density in the quantum well 5 is to be increased up to a level larger than that of an oscillation which is produced in accordance with the current injection from the first and second p-electrodes 10 and 11 so that an oscillation of transition energy $E_{2e\text{-}HH}$ between $n=2$ electron quantum level and $n=2$ heavy hole quantum level is obtained. Such an oscillation is explained in FIGS. 3A and 3B. FIG. 3A shows the distribution 22a of electron energy in a case where a threshold current is low for the reason why the loss of a resonator is low. Almost all of electrons are at $n=1$ quantum level for the reason why a threshold current is low. On the contrary, the loss of a resonator is increased in response to the decrease of the current injection down to zero from the second p-electrode 11 so that the density of electron must be increased to result in the distribution 22b of electron energy as shown in FIG. 3B. As a result, a laser oscillation occurs at a wavelength $\lambda_2$ in the vicinity of n=2 transition energy $E_{2e\text{-}HH}$ between n=2 electron quantum level and n=2 heavy hole quantum level where the density of electron is highest. As clearly understood from the above, an oscillation wavelength can be selected between wavelength $\lambda_1$ concerned with n=1 quantum level and wavelength $\lambda_2$ concerned with n=2 quantum level in accordance with the control of the current injection from the second p-electrode 11. As a matter of course, the first p-electrode 10 may be controlled to inject a predetermined level of current therefrom simultaneously.

In the embodiment mentioned above, an experiment was conducted on a semiconductor laser comprising a quantum well 5 of GaAs having the width of 110 Å and first and second guiding layers 4 and 6 of $Al_{0.2}Ga_{0.8}As$. The result thereof was that an oscillation wavelength was changed in the direction of shorter wavelength in the range of 250 Å in accordance with the shift of oscillation from n=1 transition energy $E_{1e\text{-}HH}$ to n=2 transition energy $E_{2e\text{-}HH}$ by decreasing the current injection from the second p-cladding electrode 11.

Figure 4:
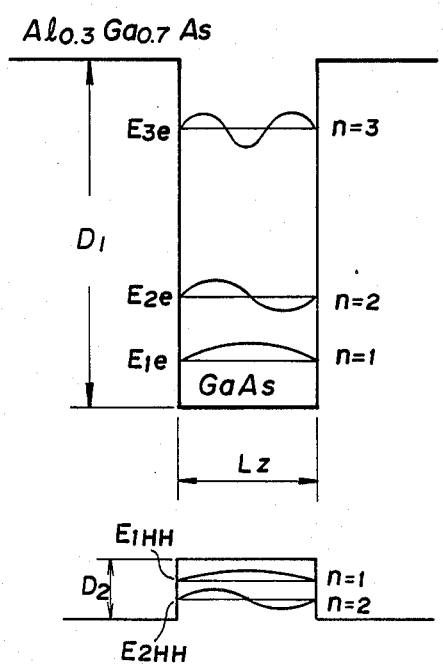
FIG. 4 is an explanatory diagram explaining quantum well in the embodiment according to the invention.

FIG. 4 shows respective wave functions for electrons and heavy holes in the $Al_{0.3}Ga_{0.7}As$/GaAs quantum well. If the quantum well width Lz is larger than 45 Å, there are n=1 and n=2 quantum levels for both electrons and heavy holes. Therefore, lasing oscillation can be changed between at n=1 transition energy and at n=2 transition energy by adjusting current injection from the first and second p-cladding electrodes. In FIG. 4, $D_1$ is the depth of conduction band, for instance, 0.318 eV while $D_2$ is the depth of valence band, for instance, 0.056 eV.

According to the invention, a semiconductor laser comprises a single-quantum well which is preferable to multi-quantum well in producing a laser oscillation at n=2 transition energy $E_{2e\text{-}HH}$. A semiconductor laser comprising multi-quantum well is described on pages 561 to 563 of "Applied physics letters 48(9), Mar. 3 1986". In the semiconductor laser described therein, the density of carrier is difficult to be practically increased up to a predetermined level so that an oscillation of high order transition energy Ene-HH (n≧2) is rather difficult to be produced.

A semiconductor laser according to the invention is fabricated as follows. First of all, there is prepared a substrate 1 of n-GaAs on which a buffer layer 2, an n-cladding layer 3, first guiding layer 4, a quantum well 5, second guiding layer 6, a p-cladding layer 7, and a cap layer 8 are formed in turn in crystal growth. Next, a high resistance region 9 is formed by the selective ion implantation of proton (or boron), and $SiO_2$ film 13, first p-electrode 10, and second p-electrode 11 are formed in photoetching process. Finally, a semiconductor laser according to the invention is completed by being provided with an n-electrode 12.

In the invention, following replacements may be applicable to the semiconductor laser mentioned above.

(a) Such a structure as planar striped structure, buried striped structure etc. may be adopted in place of $SiO_2$ striped structure.

(b) Multi-quantum well may be adopted as an active region in place of a single-quantum well.

(c) A reverse-conductive typed region like n-semiconductor layer, a region or groove having no electrode etc. may be adopted in place of a high resistance layer.

(d) Reverse-bias voltage like negative voltage may be applied to second p-electrode in place of the control of current injection therefrom to increase the loss of a resonator.

(e) Other materials like InGaAsP/InP, InGaAlAs/InP system etc. may be adopted in place of material of AlGaAs/GaAs system.

Although the invention has been described with respect to specific embodiments for complete and clear disclosure, the appended claims are not to thus limited but are to be construed as embodying all modification and alternative constructions that may occur to one skilled in the art which fairly fall within the basic teaching herein set forth.

What is claimed is:

1. A semiconductor laser comprising:
   a first cladding layer of a first conductivity type,
   at least one a quantum well active layer provided over said first cladding layer,
   a second cladding layer of a second conductivity type provided over said at least one active layer,
   resonator facets including a pair of planes approximately orthogonal to the layer structure of said first cladding layer, said at least one active layer, and said second cladding layer,
   two exclusive electrodes in ohmic contact with said second cladding layer and positioned separately in an axial direction of a resonator composed of said resonator facets, and
   a common electrode in ohmic contact with said first cladding layer and facing said exclusive electrodes.

2. A semiconductor laser according to claim 1, wherein said two electrodes are separated by a high resistance region projecting parallel to said resonator facets formed into said cladding layer.

3. A semiconductor laser according to claim 1, wherein there are provided at least one guiding layers between each of said quantum well and said first and second cladding layers, respectively.

4. A semiconductor laser according to claim 1, further including means for injecting a control current from at least one electrode od said two exclusive electrodes, such that the transition energy $E_{ke\text{-}HH}$ is selected between n=k electron quantum level and n=k heavy hole quantum level (k=1, 2, 3 ... ) in producing laser oscillation, where e is an electron level and HH is a heavy hole level.

5. A semiconductor laser according to claim 1, further including means for applying a voltage to at least one electrode od said two exclusive electrodes, such that the transition energy $E_{ke\text{-}HH}$ is selected between n=k electron quantum level and n=k heavy hole quantum level (k=1, 2, 3 ... ) in producing laser oscillation, where e is an electron level and HH is a heavy hole level.

* * * * *

UNITED STATES PATENT AND TRADEMARK OFFICE
CERTIFICATE OF CORRECTION

PATENT NO. : 4,823,352

DATED : April 18, 1989

INVENTOR(S) : Mitsunori Sugimoto

It is certified that error appears in the above-identified patent and that said Letters Patent is hereby corrected as shown below:

Column 1, line 54, delete "leaast" and insert --least--.

Column 4, line 51, delete "od" and insert --of--.

Column 4, line 59, delete "od" and insert --of--.

Signed and Sealed this

Second Day of January, 1990

Attest:

JEFFREY M. SAMUELS

Attesting Officer     Acting Commissioner of Patents and Trademarks